(12) United States Patent
Hellums

(10) Patent No.: US 6,316,993 B1
(45) Date of Patent: Nov. 13, 2001

(54) ANALOG CIRCUITRY FOR START-UP GLITCH SUPPRESSION

(75) Inventor: James R. Hellums, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/510,289

(22) Filed: Feb. 22, 2000

Related U.S. Application Data

(60) Provisional application No. 60/121,160, filed on Feb. 22, 1999.

(51) Int. Cl.[7] .............................. H03F 1/14; H04B 15/00
(52) U.S. Cl. ................. 330/51; 330/149; 381/94
(58) Field of Search ............... 330/51, 149, 297; 381/94

(56) References Cited

U.S. PATENT DOCUMENTS

| | | | |
|---|---|---|---|
| 4,502,019 | * | 2/1985 | Van Roermund ................ 330/51 |
| 4,613,823 | * | 9/1986 | Rinderle et al. ................ 330/289 |
| 4,670,720 | * | 6/1987 | Dijkmans ................ 330/51 |
| 4,956,616 | * | 9/1990 | Botti ................ 330/149 |
| 5,014,017 | * | 5/1991 | Ishiguro et al. ................ 330/51 |
| 5,399,992 | * | 3/1995 | Itakura et al. ................ 330/253 |

OTHER PUBLICATIONS

Eric A. Vittoz, "Micropower Techniques," *Design of Analog–Digigtal VLSI Circuits for Telecommunications and Signal Processing*, Second Edition, pp. 53, 66–67.

* cited by examiner

*Primary Examiner*—Robert Pascal
*Assistant Examiner*—Khanh Van Nguyen
(74) *Attorney, Agent, or Firm*—Pedro P. Hernandez; W. James Brady, III; Frederick J. Telecky, Jr.

(57) ABSTRACT

A circuit for reducing speaker "pops" and "clicks" during power on and power off transitions of an op amp driver. The circuit includes an op amp 14 having a first input terminal adapted to be coupled to an input signal and a second input terminal adapted to be coupled to a reference potential. A speaker 22 is capacitively coupled to the output terminal of the op amp 14. Also included are a first current source 26 for coupling a first bias current to the op amp, and a second current source 24 for coupling a second bias current to the op amp, the first bias current being much greater than said second bias current. A switch 28, coupled between the op amp 14 and the first current source 26, is responsive to a mode control signal PWDN(bar) for enabling and inhibiting flow of the first bias current to the op amp 14. In a preferred embodiment, the op amp is an integrated circuit device, and is a metal oxide semiconductor (MOS) circuit.

5 Claims, 1 Drawing Sheet

ANALOG CIRCUITRY FOR START-UP GLITCH SUPPRESSION

This application claims priority under 35 USC § 119(e)(1) of provisional U.S. application Ser. No. 60/121,160 filed Feb. 22,1999.

TECHNICAL FIELD OF THE INVENTION

The present invention relates generally to electronic circuits and, more particularly, to analog circuitry for suppressing speaker noise when an operational amplifier driving the speaker is powered on or off.

BACKGROUND OF THE INVENTION

Standard audio output drivers are capacitively coupled, or at least have bypass capacitors, to ground. Thus, if an operational amplifier (op amp) which drives the audio output is powered down during a "sleep" mode, for example, to save system power, the capacitor at the output will experience a small charge as the op amp is powered down, or a small discharge when the op amp is powered up. This charging and discharging will cause the voltage to change, and will be heard through the speaker load. The sound is like a "pop" or a "click", and is considered to be highly undesirable in audio systems.

A prior art method to suppress this noise is shown in FIG. 1. In this approach, PWDN (PoWer DowN) is a digital signal that turns the bias current to the op amp off so that the entire circuit goes to a high impedance state. PWDN(bar) is the inverted state of this digital signal and is used to turn an FET switch on so that a blocking capacitor, $C_B$, charges to the dc value of the system ground. This also is the dc voltage when there is no signal applied to the input node of the op amp.

A problem with this approach is that the op amp has an input-referred offset voltage which may be around 1–3 mV. This voltage is the difference between the system ground and the output of the op amp (in unity gain, $R_i = R_f$) when the op amp is on. So when the op amp is turned on the offset voltage will charge the capacitor and cause a "glitch." A standard measure of this voltage transient is called "glitch impulse" or "glitch energy." It is equal to the integral of the output voltage over time ($\int_o^\infty V_o dt$), with units of volt-seconds (V-s). For the prior art circuit shown, the glitch energy is on the order of $10^{-4}$ V-s. While this approach reduces the amount of speaker noise during transitions between the powered up and sleep modes, it does not reduce the "pops" and "clicks" to below an audible level.

SUMMARY OF THE INVENTION

In view of the above statement of the prior art in this technology, it is a primary objective of the present invention to provide analog circuitry which provides improved glitch energy suppression in a driver circuit during power down and power up of an op amp driving a speaker load.

In accordance with the principles of the present invention, there is disclosed bias current supply means for use in an operational amplifier (op amp) having a first input terminal adapted to be coupled to an input signal, a second input terminal adapted to be coupled to a reference potential and an output terminal adapted to be capacitively coupled to a load device. The bias current supply means includes means for coupling a first bias current to the op amp, means for coupling a second bias current to the op amp, the first bias current being much greater than the second bias current, and switch means responsive to a mode control signal for enabling either the first bias current or the second bias current to the op amp.

BRIEF DESCRIPTION OF THE DRAWING

The foregoing features of the present invention may be understood more fully from the following detailed description, read in conjunction with the accompanying drawings, wherein.

DESCRIPTION OF THE PREFERRED EMBODIMENT

Figure 2:
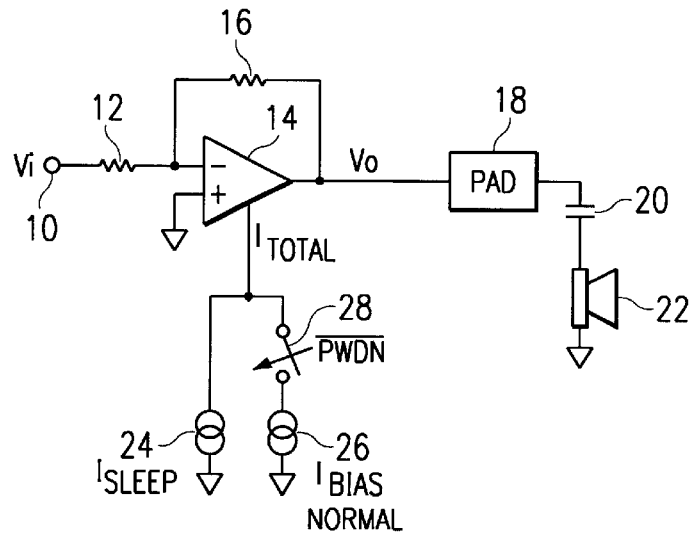
FIG. 2 illustrates a start-up noise suppression circuit in accordance with the present invention.

Referring to FIG. 2, there is shown a driver circuit for an audio speaker which includes a power-saving sleep mode, and which provides improved glitch suppression when powering down and when powering up. According to the embodiment of FIG. 2, input terminal 10 is adapted to receive a time-varying input signal designated as $v_i$. An input resistor 12 is coupled between input terminal 10 and the inverting (−) input node to an op amp 14, typically an integrated circuit device. A feedback resistor 16 is coupled between the output node of op amp 14 and its inverting input node. Op amp 14 drives its output signal, designated as $v_o$, onto an integrated circuit bond pad 18. External load circuitry consisting of a blocking capacitor 20 and an audio speaker 22 are coupled in series between bond pad 18 and reference ground.

Figure 1:
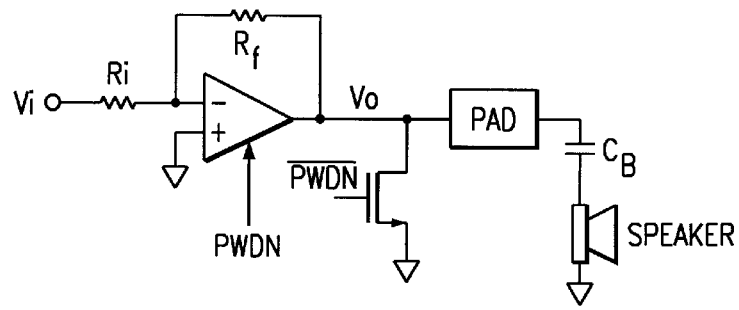
FIG. 1 illustrates a start-up noise suppression circuit in accordance with the prior art.

The bias current node of op amp 14 is coupled to a first current source 24, designated $I_{sleep}$, and also to the series combination of a second current source 26, designated $I_{bias\ normal}$, and a switch 28 which is closed by the application of the signal PWDN(bar), comparable to the digital signal of the same name referred to in the prior art circuit of FIG. 1. The magnitude of $I_{bias\ normal}$ is on the order of a few milliamperes; the magnitude of $I_{sleep}$ is on the order of a few microamperes. When switch 28 is closed, as in the powered up mode, $I_{total}$ into op amp 14 is the sum of $I_{bias\ normal}$ and $I_{sleep}$; when switch 28 is open, as in the sleep mode, $I_{total}$ into op amp 14 is just $I_{sleep}$. Although switch 28 is depicted functionally, it will be recognized that an actual implementation would be likely to consist of a semiconductor device, such as an FET.

The concept underlying my invention is based on the idea that if op amp 14 drives the load which includes charging capacitor 20 continuously, the glitches are eliminated. The sleep mode is enabled by opening switch 28, thereby disconnecting the main bias current source 26 from op amp 14 while leaving a small amount of current, provided by sleep current source 24, to keep op amp 14 "working." By "working," it is meant that op amp 14 maintains high voltage gain, the output impedance remains sufficiently low to maintain the charge on external capacitor 20, and while the bandwidth decreases with the reduction in bias current, only a dc level must be maintained on capacitor 20 at this time. During the powered on mode, switch 28 conducts permitting bias current to flow through op amp 14 from both current sources 24 and 26.

In metal oxide semiconductor (MOS) technology, to which the preferred embodiment of the present invention is primarily directed, the offset voltage of the op amp is set predominantly by the input pair matching. I have taken advantage of MOS physics to keep the offset voltage of the op amp differential pair from shifting. As the bias current is reduced, the matching stays the same or gets slightly better.

This fact has been shown in Design of Analog-Digital VLSI Circuits for Telecommunications and Signal Processing, Second Edition, edited by J. E. Franca and Y Tsividis, Prentice Hall, Englewood Cliffs, N.J., 1994. The author of Chapter 3, Eric A. Vittoz, shows in FIG. 10(b) of this reference, reproduced herein as FIG. 3, a plot of the standard deviation of an MOS input pair offset voltage versus bias current, which demonstrates the matching of drain current as functions of the inversion coefficient of the transistors. In this plot, the value of 0.01 is subthreshold, 100 is strong inversion and 1 is the boundary between subthreshold and strong inversion.

Figure 3:
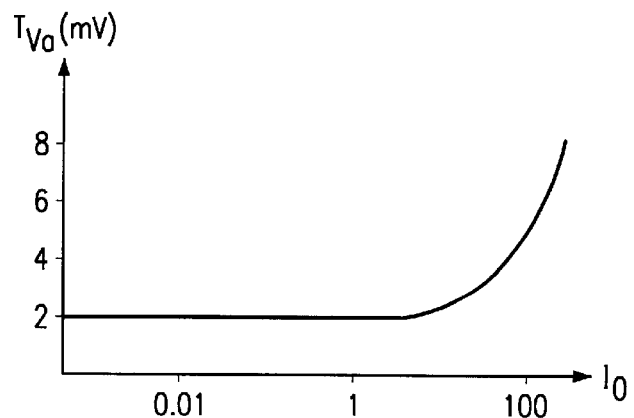
FIG. 3 is a plot of offset vs. bias current useful in understanding the circuit of the present invention.

In normal design of MOS op amps the input pair is designed at normal bias currents to be about 1 on the plot of FIG. 3. Therefore, even when the bias current is greatly reduced, the offset voltage does not shift. This indicates that blocking capacitor 20 remains charged to the same voltage (i.e., the offset voltage) when fully powered up or when in the sleep mode. The only charging or discharging comes in the transition between modes. The improvement can be seen by the following numerical results. In a standard audio line driver op amp, the total current when the device is powered on is approximately 2.3 milliamperes (mA). In the sleep mode, the total current drawn by the device is approximately 4.3 microamperes ($\mu$A). Using the formula stated earlier, glitch energy $=\int_o^\infty V_o dt$, it is seen that in the transition from the powered on mode to the sleep mode, the glitch energy is $3.2 \times 10^{-8}$ V-s, and in the transition from the sleep mode to the powered on mode, the glitch energy is $2.6 \times 10^{-8}$ V-s. This represents an improvement of about four orders of magnitude over the circuit of the prior art, resulting in no audible "pop" or "click" from the speaker in response to entering either the sleep mode or the powered up mode.

In one circuit realization of the present invention, intended for use with audio frequency signals, input resistor 12 and feedback resistor 16 are both 10 kilolun resistors, and blocking capacitor 20 is a 10 microfarad capacitor. Op amp 14 is typically a standard, two-stage power amplifier. Speaker 22 is typically a 4–16 ohm device. In reduced bandwidth applications, such as telephony, resistors 12 and 16 may be as large as 100 kilohms.

While the principles of the present invention have been demonstrated with particular regards to the structure and method disclosed herein, it will be recognized that various departures may be undertaken in the practice of the invention. The scope of the invention is not intended to be limited to the particular structure and method disclosed herein, but should instead be gauged by the breadth of the claims which follow.

What is claimed is:

1. An operational amplifier (op amp) circuit having an offset voltage, the operational amplifier circuit comprising:
   a first input terminal adapted to be coupled to an input signal;
   a second input terminal adapted to be coupled to a reference potential;
   an output terminal coupled to said first and second input terminals and adapted to be capacitively coupled to a load device; and
   a bias current supply means including:
      means for coupling a first bias current to said op amp circuit;
      means for coupling a second bias current to said op amp circuit, said first bias current being much greater than said second bias current;
      switch means responsive to a mode control signal for enabling or inhibiting said first bias current to said op amp circuit; and
      wherein said offset voltage remains substantially the same when said first bias current is enabled or inhibited.

2. An operational amplifier (op amp) circuit having an offset voltage, the operational amplifier circuit comprising:
   a first input terminal adapted to be coupled to an input signal;
   a second input terminal adapted to be coupled to a reference potential;
   an output terminal coupled to said first and second input terminals and adapted to be capacitively coupled to a load device; and
   a bias current supply means including:
      a first current source for coupling a first bias current to said op amp circuit;
      a second current source for coupling a second bias current to said op amp circuit, said first bias current being much greater than said second bias current;
      a switch coupled between said op amp and said first current source, said switch responsive to a mode control signal for enabling and inhibiting flow of said first bias current to said op amp circuit; and
      wherein said offset voltage remains substantially the same when said first bias current is enabled or inhibited.

3. Circuitry comprising:
   an operational amplifier (op amp) having a first input terminal adapted to be coupled to an input signal, a second input terminal adapted to be coupled to a reference potential, an offset voltage, and an output terminal;
   a load device capacitively coupled to said op amp output terminal;
   a first current source for coupling a first bias current to said op amp;
   a second current source for coupling a second bias current to said op amp, said first bias current being much greater than said second bias current;
   a switch coupled between said op amp and said first current source, said switch responsive to a mode control signal for enabling and inhibiting flow of said first bias current to said op amp; and
   wherein said offset voltage remains substantially the same when said first bias current is enabled or inhibited.

4. The circuitry in accordance with claim 3 wherein said op amp is an integrated circuit device.

5. The circuitry in accordance with claim 4 wherein said op amp is a metal oxide semiconductor (MOS) circuit.

* * * * *